United States Patent
Lamerichs et al.

(10) Patent No.: US 7,667,460 B2
(45) Date of Patent: Feb. 23, 2010

(54) DISTINGUISHING BOUND AND UNBOUND CONTRAST AGENTS USING MAGNETIC RESONANCE

(75) Inventors: Rudolf Mathias Johannes Nicolaas Lamerichs, Eindhoven (NL); Rene Theodorus Wegh, Eindhoven (NL); Jeroen Alphons Pikkemaat, Eindhoven (NL); Holger Gruell, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/094,270

(22) PCT Filed: Nov. 22, 2006

(86) PCT No.: PCT/IB2006/054383
§ 371 (c)(1),
(2), (4) Date: May 20, 2008

(87) PCT Pub. No.: WO2007/063454
PCT Pub. Date: Jun. 7, 2007

(65) Prior Publication Data
US 2008/0258726 A1 Oct. 23, 2008

(30) Foreign Application Priority Data
Nov. 29, 2005 (EP) .................................. 05111437

(51) Int. Cl.
*G01V 3/00* (2006.01)
(52) U.S. Cl. ........................................ 324/309; 600/420
(58) Field of Classification Search .................. 324/309, 324/307; 600/419, 420
See application file for complete search history.

(56) References Cited

U.S. PATENT DOCUMENTS

| 5,345,175 | A | 9/1994 | Kasuboski et al. |
| 6,198,960 | B1 * | 3/2001 | Fain et al. ................... 600/419 |
| 6,205,349 | B1 * | 3/2001 | Kim et al. ................... 600/420 |
| 6,861,045 | B1 | 3/2005 | Lauffer et al. |

FOREIGN PATENT DOCUMENTS

| WO | 2004055539 A1 | 7/2004 |
| WO | 2005079274 A2 | 9/2005 |

OTHER PUBLICATIONS

Boesch, C., et al.; Dipolar coupling and ordering effects observed in magnetic resonance spectra of skeletal muscle; 2001; NMR in Biomedicine; 14:140-148.

(Continued)

*Primary Examiner*—Louis M Arana

(57) ABSTRACT

Magnetic resonance monitoring of a target (30) uses the detected magnetic resonance to determine movement such as diffusion of contrast agent relative to the object, and uses the movement to discriminate (50, 60) a part of the contrast agent which is bound to the target, from the rest of the contrast agent. The need for clearing agents can be avoided or reduced, and hence imaging is instantaneous. A "stationary spin map" of the object can be formed by comparing the movements in the different directions, and determining if the differences between them are less than a given threshold. Determining isotropic movement in this way for a number of locations on the object allows the map to be generated.

18 Claims, 2 Drawing Sheets

OTHER PUBLICATIONS

Figure 1:
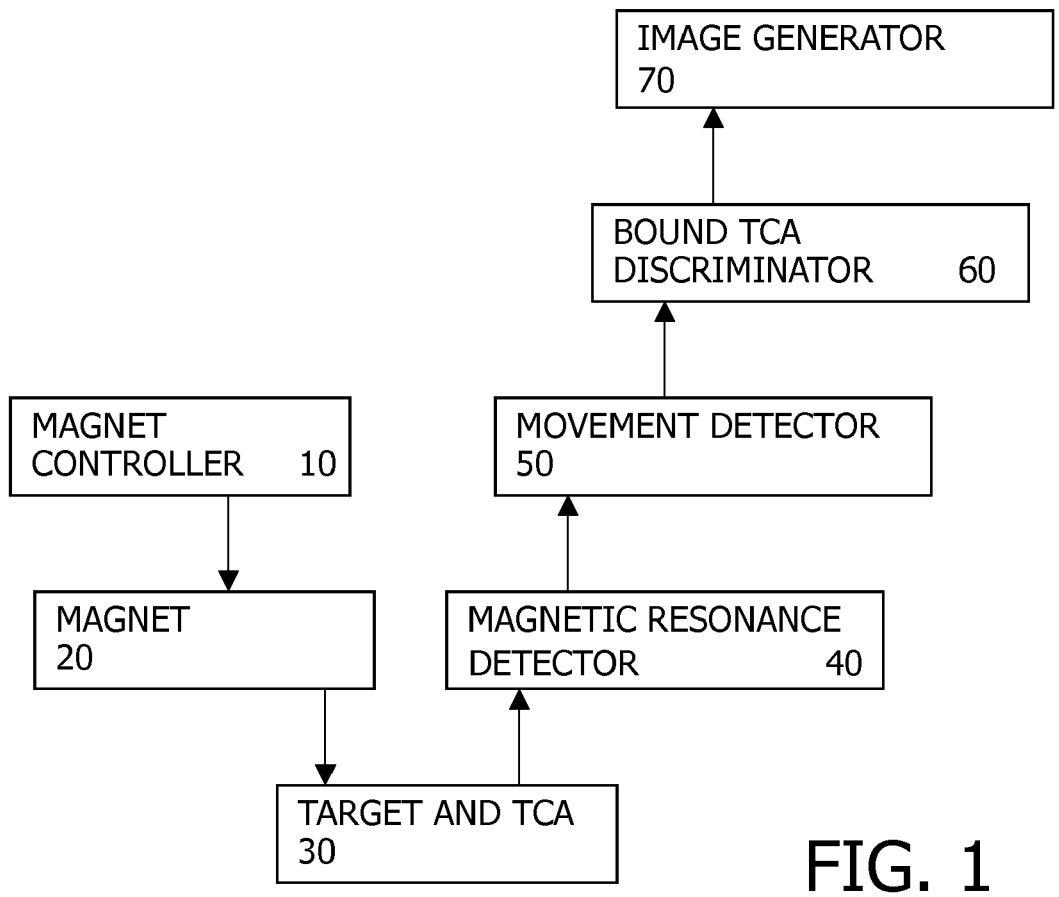

Clark, C. A., et al.; Water Diffusion Compartmentation and Anisotropy at High b Values in the Human Brain; 2000; MRM; 44:852-859.

Dreher, W., et al.; Changes in Apparent Diffusion Coefficients of Metabolites in Rat Brain After Middle Cerebral Artery Occlusion Measured by Proton Magnetic Resonance Spectroscopy; 2001; MRM; 45:383-389.

Govindan, S. V., et al.; Use of Galactosylated-Streptavidin as a Clearing Agent with 111In-Labeled, Biotinylated Antibodies to Enhance Tumor/Non-Tumor Localization Ratios; 2002; Cancer Biotherapy & Radiopharmaceuticals; 17 (3)307-316.

Morawski, A. M., et al.; Quantitative "Magnetic Resonance Immunohistochemistry" with Ligand-Targeted 19F Nanoparticles; 2004; MRM; 52:1255-1262.

Aime, S., et al.; Highly Sensitive MRI Chemical Exchange Saturation Transfer Agents Using Liposomes; 2005; Angew. Chem. Int. Ed.; 44:5513-5515.

Nolte, U. G., et al.; Rapid Isotropic Diffusion Mapping Without Susceptibility Artifacts: Whole Brain Studies Using Diffusion-Weighted Single-Shot Steam MR Imaging; 2000; MRM; 44:731-736.

Sarlls, J. E., et al.; Isotropic Diffusion Weighting in Radial Fast Spin-Echo Magnetic Resonance Imaging; 2005; MRM; 53:1347-1354.

* cited by examiner

DISTINGUISHING BOUND AND UNBOUND CONTRAST AGENTS USING MAGNETIC RESONANCE

This invention relates to magnetic resonance methods, and to corresponding apparatus and software.

It is known that any nucleus, which possesses a magnetic moment attempts to align itself with the direction of a magnetic field in which it is located. In doing so, however, the nucleus precesses around this direction at a characteristic angular frequency (Larmor frequency), which is dependent on the strength of the magnetic field and on the properties of the specific nuclear species (the magnetogyric constant γ of the nucleus). Nuclei which exhibit this phenomenon are referred to as having "spin".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment Mz is produced in the direction of the polarizing field, but the randomly oriented magnetic components in the perpendicular, or transverse, plane (x-y plane) cancel one another. If, however, the substance, or tissue, is subjected to an electro-magnetic field with (nearly) the same frequency, as the precession frequency, with the magnetic component of this field, the excitation field $B_1$, in the x-y plane, the net aligned magnetic moment may be rotated, or "tipped", into the x-y plane to produce a net transverse magnetic moment Mt, which is rotating, or spinning, in the xy plane at the Larmor frequency. A signal is emitted by the excited spins after the excitation signal $B_1$ is terminated. There are a wide variety of measurement sequences in which this nuclear magnetic resonance ("NMR") phenomenon is exploited.

When utilizing NMR to produce images, one of several techniques is employed to obtain NMR signals from specific locations in the subject. Typically, the region that is to be imaged (region of interest) is scanned by a sequence of NMR measurement cycles, which vary according to the particular localization method being used. The resulting set of received NMR signals are digitized and processed to reconstruct the image using one of many well-known reconstruction techniques. To perform such a scan, it is, of course, necessary to elicit NMR signals from specific locations in the subject. This can be accomplished by employing magnetic field gradients (Gx, Gy, and Gz) along the respective x, y and z axes. By controlling the strength of these gradients during each NMR cycle, the spatial distribution of spin excitation can be controlled and the location of the resulting NMR signals can be identified.

It is known to carry out diffusion weighted imaging by using a pair of large gradient pulses at the beginning of the pulse sequence to sensitize the acquired NMR signals to spin motion. The principle of diffusion imaging is based on the integration of two diffusion-sensitive gradient pulses in a standard pulse sequence. When the first gradient pulse is switched on, the different precession frequencies of the spin phases at different positions in the gradient field will lead to spin dephasing. A second 'opposite' gradient pulse refocuses the different spin phases. However, due to additional net molecular movement of the protons, the phase cannot be completely refocused, resulting in a reduction in the MR signal. In standard MR sequences, this phenomenon only plays a minor role. In diffusion-weighted sequences, however, the signal loss due to phase incoherence or dephasing, is used to create the image. Diffusion coefficients can be calculated from acquisitions with different diffusion weightings. A measure for the diffusion weighting is the b-value. The b-value increases with the strength, duration and temporal separation of the two diffusion-sensitive gradient pulses. Diffusion Weighted MR is currently used to study e.g. irregularities in blood flow and to determine the direction of tissue fibers, e.g. fiber tracking, as shown in "Water diffusion compartmentation and anisotropy at high b values in the human brain" Chris A. Clark, Denis Le Bihan. Magnetic Resonance in Medicine, Volume 44, Issue 6, Date: December 2000, Pages: 852-859, and "Changes in apparent diffusion coefficients of metabolites in rat brain after middle cerebral artery occlusion measured by proton magnetic resonance spectroscopy" Wolfgang Dreher, Elmar Busch, Dieter Leibfritz. Magn Reson Med Volume 45, Issue 3, Date: March 2001, Pages: 383-389.

For molecular imaging with MRI, contrast agents can be used that bind specifically to a well defined biomarker. These biomarkers are chosen specifically for certain diseases and treatments. These are called targeted contrast agents tCA. After administration of the agent, the binding of the tCA to the biomarker will take place over a period of typically up to a few hours. The animal or human body will therefore typically contain quantities of both bound and unbound tCA. To detect specifically the fraction of bound tCA, one known strategy is to simply wait for sufficient 'wash out' of the unbound fraction, a naturally occurring process. Depending on the type of agent, this process can take several hours up to a few days, which is obviously a big drawback for practical clinical applications. Alternatively, so-called clearing agents may be used when it is not possible to wait for a long time for the washout, as known from "Use of galactosylated-streptavidin as a clearing agent with 111In-labeled, biotinylated antibodies to enhance tumor/non-tumor localization ratios" Govindan, Serengulam V.; Griffiths, Gary L.; Michel, Rosana B.; Andrews, Philip M.; Goldenberg, David M.; Mattes, M. Jules. Immunomedics, Inc., Morris Plains, N.J., USA. Cancer Biotherapy & Radiopharmaceuticals (2002), 17(3), 307-316. Such agents facilitate the excretion of unbound tCA, mostly through binding to the tCA. The main disadvantage of clearing agents for clinical routine is that two successive administrations for one routine are required, which is clinically unfavourable. For that reason, such a procedure will probably not be implemented in the clinic. In addition, approval by the FDA or other regulatory bodies is required for the clearing agent as well, complementary to the approval of the tCA itself.

Furthermore, one could anticipate a situation in which a dynamic equilibrium exists between bound and unbound tCA. In this case one cannot wait for the washout or use a clearing agent, because the presence of the unbound tCA is also required.

It is known from U.S. Pat. No. 6,861,045 to use a contrast agent whose MRI response changes when it is bound, owing to a change in induced relaxation rate of water protons ($1/T_1$ or $1/T_2$) for example.

An object of the invention is to provide improved apparatus or methods relating to magnetic resonance and corresponding software. According to a first aspect, the invention provides:

A method of processing data relating to detected magnetic resonance of a contrast agent obtained from magnetic resonance monitoring of an object, e.g. a human or animal patient, the method comprising:

using a magnetic resonance monitoring method to detect magnetic resonance signals that are sensitive to movement of the contrast agent. These signals discriminate a part of the contrast agent which is bound to the object, from the rest of the contrast agent, which is unbound and therefore still moving. The contrast agent may be a targeted contrast agent, i.e. it binds to a target in the object.

The present invention also provides a method of processing data relating to detected magnetic resonance of a contrast agent obtained from magnetic resonance monitoring of an object, e.g. a human or animal patient, the method comprising:

detecting magnetic resonance of the contrast agent, using the detected magnetic resonance to determine movement of the contrast agent relative to the object, and using the determined movement to discriminate a part of the contrast agent which is bound to the object, from the rest of the contrast agent. The contrast agent may be a targeted contrast agent, i.e. it binds to a target in the object. The determination or movement step is then in relation to the target to which the contrast agent is bound.

The present invention is notable for enabling the need for clearing agents to be avoided or reduced, and hence enabling more instantaneous measurement or imaging. This is particularly useful where clinically relevant information resides in the bound tCA only. It can be applied to MR imaging and MR spectroscopy for example.

The method may also include: determining from the detected magnetic resonance signals contrast agent which is moving relative to the object, and discriminating therefrom a part of the contrast agent which is bound to the object, from the rest of the contrast agent.

In a further advantageous embodiment the magnetic resonance monitoring is performed at multiple locations on the object, the method comprising: using the results of the monitoring to form an image of the bound contrast agent by de-emphasis of any parts of the image found to have anisotropic movement.

A further feature of the present invention is that the detected magnetic resonance is obtained by applying a magnetic field gradient in a first direction to dephase spins of the contrast agent. Where the detected magnetic resonance is obtained by rephasing the spins, the method may also comprise: comparing the resonance after rephasing with the resonance before dephasing, to determine movement in the first direction of the contrast agent. The detected magnetic resonance can then also be obtained by repeating the steps of dephasing and rephasing in other directions, the method comprising detecting movement of the contrast agent in the other directions. This provides the advantage of giving more information about movement of the contrast agent, e.g. to generate a map. The rephasing may also include inverting the phase of the spins then repeating application of the magnetic gradient.

In a further feature the discriminating of the bound part of the contrast agent includes the step of determining if movement in any of the directions is below a threshold value.

In a further feature the step of assessing isotropic movement is performed by comparing the movement in all the directions for each location and if the differences in movements are less than a given threshold value, determining that the movement is isotropic for that location.

Another feature is that the isotropic movement is analyzed and if the signal decrease is within a given threshold the movement is stationary for that location.

To improve detection, the contrast agent may have a unique MR signature, or has a proton signal at a unique chemical shift compared to water. For example, the contrast agent may comprise fluorine, which provides a recognizable signature.

In another aspect the present invention provides a magnetic resonance monitoring apparatus having a detector to detect magnetic resonance of a contrast agent in an object the apparatus comprising means for monitoring magnetic resonance to detect magnetic resonance signals that are sensitive to movement of the targeted contrast agent, a detector to determine movement of the contrast agent relative to the object using the detected magnetic resonance, and a discriminator to discriminate a part of the contrast agent which is bound to the object, from the rest of the contrast agent using the detected movement.

When the contrast agent is a targeted contrast agent, the discriminator can be adapted for discriminating a part of the contrast agent which binds itself to the target, from the rest of the contrast agent.

A further advantageous feature is to provide means to monitor multiple locations on the body and having an image generator to form an image of the bound contrast agent using the results of the monitoring.

A further feature of the present invention is ha magnet controller for applying a magnetic gradient in a first direction to dephase spins of the contrast agent. Advantageously, the magnet controller can be arranged to dephase and then rephase the spins to thereby determine movement in the first direction.

A further feature of the present invention is that the magnet controller can be arranged to repeat the steps of dephasing and rephasing in other directions to enable detection of movement in other directions.

To improve the discrimination, e.g. with respect to noise, the discriminator can be arranged to determine if movement in any of the directions is below a threshold.

In another feature of the present invention the discriminator has a comparator arranged to compare the movement in all the directions for each location to determine that the movement is isotropic for that location, and that the signal loss of the isotropic movement does not exceed a given threshold and the image generator being arranged to form a map for the stationary spins from an output of the discriminator.

Another aspect provides a method of processing detected magnetic resonances of a contrast agent to produce an isotropy map, having the steps of using the detected magnetic resonances to determine movement of the contrast agent relative to the object in a number of directions, comparing the movements in the different directions, determining if the differences between them are less than a given threshold to determine that the movement is isotropic for that location, and furthermore, comparing the signal intensities to the signal intensity in the baseline image, e.g. an image, which is not sensitive to movement. Those signals that are isotropic and close to the baseline value are used to form the isotropy map.

Such a map is a new type of parametric map that can show features more clearly, such as areas of targeted contrast agent which has bound itself to the target.

The present invention also provides a computer program on a machine readable medium for a magnetic resonance monitoring apparatus for carrying out any of the methods of the present invention.

Additional features of the present invention and other advantages are discussed below.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

Figure 2:
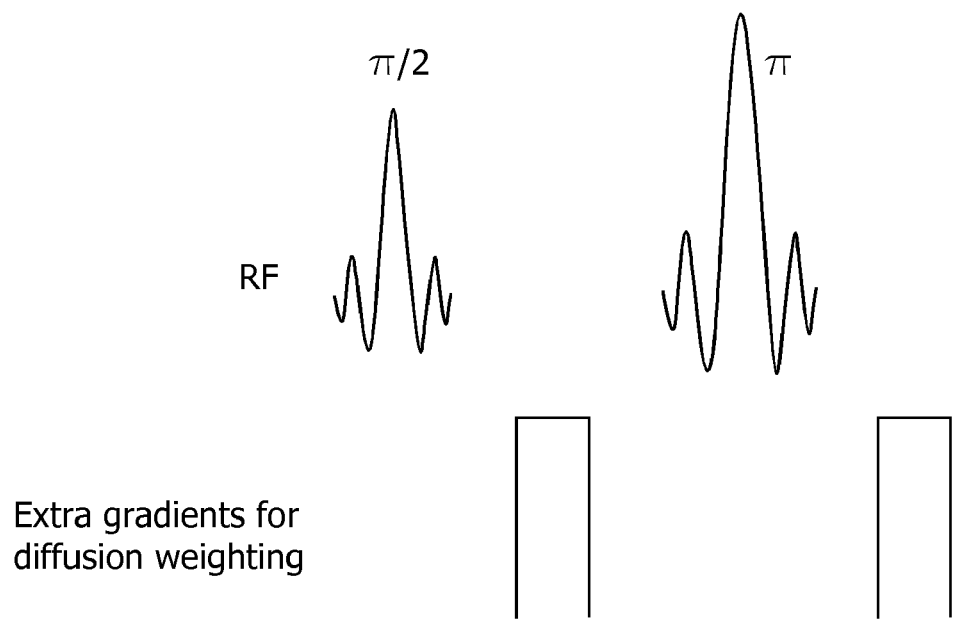
Figure 3:
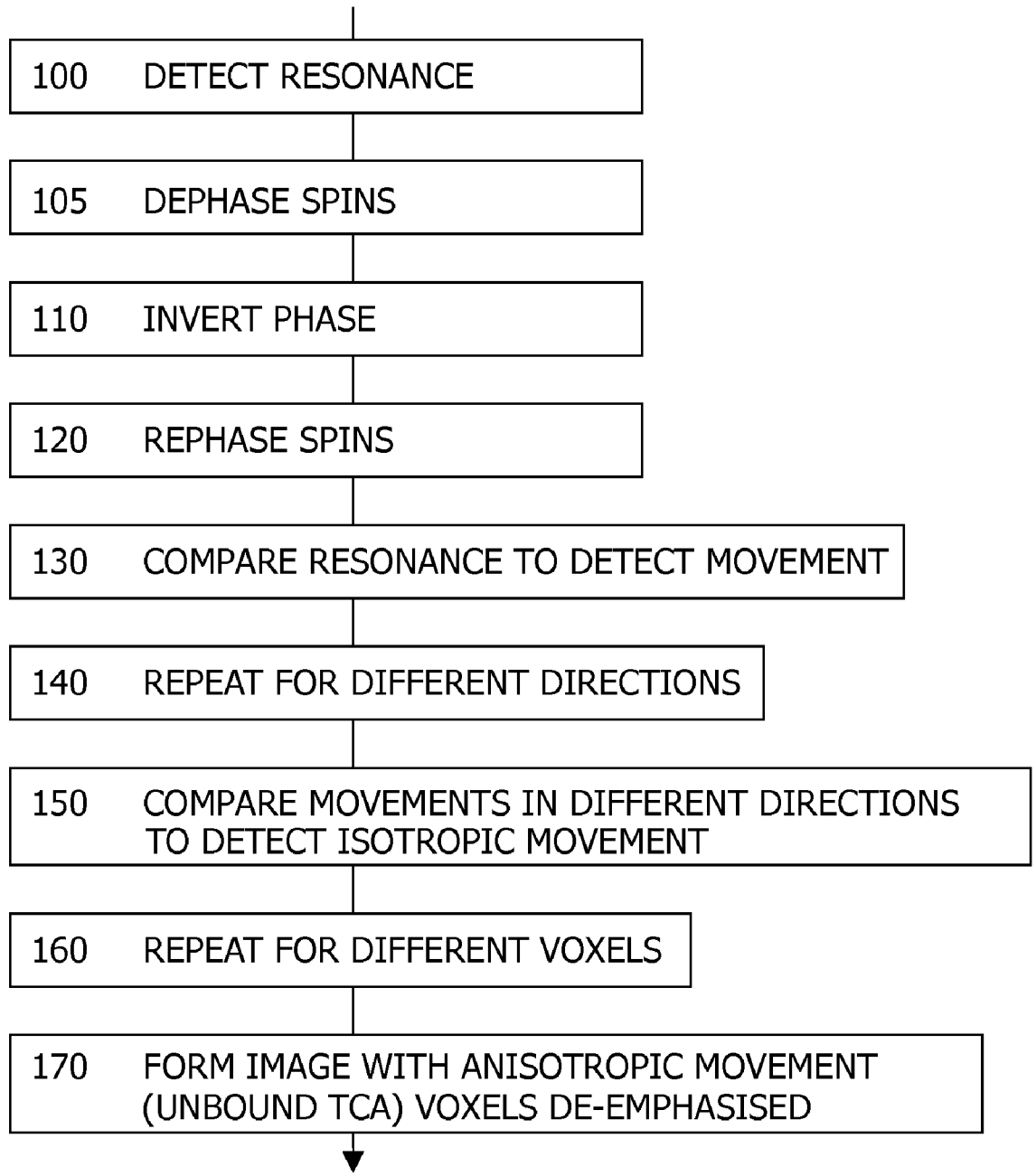

How the present invention may be put into effect will now be described by way of example with reference to the appended drawings, in which:

FIG. 1 shows a schematic view of some of the features of a magnetic resonance monitoring system according to an embodiment, FIG. 2 shows a time sequence of RF pulses and gradients controlled by the magnet controller according to an embodiment, and FIG. 3 shows a flow chart of a method of monitoring according to an embodiment.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Embodiments of the present invention use an MR scanning approach that specifically suppresses the MR signal from the unbound fraction of a contrast agent, and acquires or drives an MR image from only the bound fraction, tCA. The contrast agent is typically administered to the human or animal patient by conventional means. MR imaging and spectroscopy (MRS) methods that can detect specifically the fraction of bound tCA in presence of unbound tCA are useful for a number of reasons, for example it is not required either to wait for the wash-out of unbound tCA, or to use a clearing agent to facilitate the removal of unbound tCA from the body. The scanning methods also enable instantaneous MRI or MRS measurement of bound tCA.

Embodiments of the present invention can exploit the fact that for use on animal or human bodies, unbound tCA will be still present in the blood (or in the lumen of the intestine) and will be moving. On the other hand the bound tCA will no longer move.

Whereas the current clinical use of DWI (Diffusion Weighted Imaging) is for detecting both changes in contrast due to different mobilities and on the anisotropy caused by tissue fibers, in accordance with embodiments of the present invention DWI is used to discriminate and/or to neglect the moving contrast agent fraction. The 'diffusion' gradients are used to cause a net dephasing of the signal of the spins of moving contrast agent. Subsequently, only the signal of the bound tCA will be fully rephased and this signal can then be used for various purposes. One is to generate a map of the bound tCA. Since the rephasing of the bound tCA is true for all directions of the diffusion (i.e. is isotropic), the map of the bound tCA can be called a 'stationary spin map' (explained in more detail below). In the case of unbound tCA that is still present in the blood (or in the lumen of the intestine), it can be expected that the difference in mobility between bound and unbound tCA is large and consequently only small gradients will be required. In DWI terminology this means that low b-values will be sufficient. The b-value summarizes the influence of the gradients on the diffusion weighted images. The higher the value b, the stronger the diffusion weighting. The use of low b-values means that the increase in TR (time to repeat) and thus acquisition time for this improved detection method can be negligible. Since the direction of flow in a given volume can be in any direction, the diffusion gradients have to be applied in a number of spatial directions, preferably in a representative number of directions. The number of directions is typically three, i.e. the orthogonal main directions, x, y and z respectively, or more. Depending on the direction of the flow of the unbound tCA, some directions of the diffusion gradients will result in larger signal decrease than others, i.e. the effect of the diffusion is anisotropic.

It is known that there are several parametric images, which can be reconstructed from the diffusion-weighted images with different orientations for the diffusion gradients. The most common parametric images are the relative anisotropy (RA) map and the fractional anisotropy (FA) map. For the bound tCA the diffusion will be very small (zero) in all directions (i.e. isotropic), while for the unbound tCA the anisotropy will be largest for the diffusion directions parallel (in line) with the flow of the unbound tCA.

Also known from literature is the isotropic diffusion weighted imaging (MRM 53: 1347-1354, 2005 MRM 44: 731-736, 2000) in which the signal intensity of all three orthogonal images is weighted according to the relation $\sqrt[3]{S_x \cdot S_y \cdot S_z}$. In this approach all signal intensities for all voxels are weighted in the final images. In embodiments of the present invention the signals for the different special directions are first analysed separately, and compared to the baseline image ($S_0$), with the diffusion gradients on zero. If, in one or more direction, the signal intensity in the diffusion-weighted images is lower than the baseline value, these voxel values will be set to zero. For all voxels that fulfil the condition that the diffusion is isotropic and the signal intensity is close to the signal intensity in then base line scan, either the isotropic value ($\sqrt[3]{S_x \cdot S_y \cdot S_z}$) or the baseline value ($S_0$) will be used, to yield a 'stationary spin map'.

A second situation where differentiating bound versus unbound tCA is required will be in molecular imaging of tumours. In tumours, the blood vessels will generally be very permeable. This allows extravasation of relatively large molecules or particles. Therefore, even large nanoparticles can be used as a base for the tCA. The unbound extravasated tCA will have a (slightly) higher diffusion constant than the bound tCA. If the tissue is fibrous of nature the diffusion might again be anisotropic. In general, the difference in diffusion constants of the bound tCA versus the unbound extravasated tCA in the interstitium will be quite small, requiring delicate fine tuning of the b-value.

A pre-requisite for applying the described method is that the tCA preferably contains a unique MR signature, i.e. a nucleus (nuclei) that resonates at frequencies other than 1H, and is naturally not present in the object. Commonly used is fluorine 19F (A. M. Morawski et. al., Mag. Res. Med. 52, 1255 (2004)). Another possibility is that the tCA has a proton signal at a unique chemical shift compared to water. Such contrast agents include the so-called LIPOCEST agents recently proposed by the University of Turin (Silvio Aime, Daniela Delli Castelli, and Enzo Terreno, Angew. Chem. Int. Ed. 44, 5513 (2005)). The MR scanning approach described here enables faster imaging of the bound tCA, and is particularly important in the case of tCAs that currently require the use of clearing agents.

A first embodiment of the invention, illustrated in FIG. 1 shows a magnet controller 10, controlling a magnetic field generator 20 arranged next to a patient to whom a contrast agent has been administered. In the patient there is a specific target to which the contrast agent tCA 30 is attracted or to which the contrast agent tCA 30 binds. Magnetic resonance from the tCA is picked up by detector 40, and fed to movement detector 50 and discriminator 60 for discriminating the bound tCA. This is coupled to image generator 70 for generating an image such as a stationary spin map of the object. The movement detector, the discriminator and the image generator can be implemented in software in conventional languages executed by conventional hardware. The magnetic field generator 20 can use conventional coils, typically including gradient coils in 3 directions, and RF coils. The gradient coils can produce a linear variation in field along one direction, and have high efficiency, low inductance and low resistance, in order to minimize the current requirements and heat deposition. A Maxwell coil usually produces linear variation in field along the z-axis; in the other two axes a saddle coil, such as a Golay coil can be used for example. The radio frequency coils used to excite the nuclei can include surface coils and volume coils. For spatial encoding, the gradient coil sub-system of the MRI scanner is responsible for the encoding of specialized contrast such as flow information, diffusion information, and modulation of magnetization for spatial tagging. The gradient coil or coils used to produce the diffusion need not be a separate gradient or gradients from those used for spatial encoding. The degree of diffusion weighting is dependent primarily on the area under the diffusion gradients and on the interval between the gradients. Other factors include the effect of the spatial localization gradients and the size of the voxels (i.e. three-dimensional pixels).

The detector 40 typically includes coils for detecting a signal, amplification circuitry, and an analog to digital converter turns the nuclear magnetic resonance signal to a digital signal. This is typically sent to a processor for Fourier transformation before further processing by the movement detector 50 for example. Ultimately the image of an MRI scan can be displayed on a monitor, or in the case of spectroscopy, a profile of response at different frequencies can be shown.

Some of the embodiments involve combining the application of dephasing gradients in both MR imaging and spectroscopy with the targeted contrast agents. After administration of a tCA to the patient the specific MR sequence is applied in order to suppress the MR signal from the unbound fraction of the tCA. A pulse sequence for a DWI based embodiment uses an additional diffusion gradient around an echo pulse as shown in FIG. 2. The stationary spins are dephased by the first gradient. The $\pi$ pulse inverts the phase of the spins and the signal will be rephased by the second gradient. Spins which did not move in the direction of the diffusion gradients will experience a rephasing gradient with the same strength as the dephasing gradient. Therefore, the signal will have the same intensity as it would have had without applying the diffusion gradients. Spins moving in the same physical direction as the orientation of the gradients will experience a rephasing gradient with a different strength than the dephasing gradient, i.e. the spins have moved to another position with respect to the isocentre or zero point of the gradient. Then, the signal will have decreased significantly as a result of the diffusion gradients.

For the 'stationary spin map' the signal intensity is analysed on a pixel-by-pixel basis in all DW images with different diffusion directions by the image generator and compared to the signal intensity in an image recorded with the diffusion gradient switched to zero, e.g. the baseline image. If there is a difference in signal intensity in one or more directions, the diffusion has an anisotropic component and the pixel will be assigned the lowest signal intensity of the various images or it will be set to zero. If the diffusion is isotropic and within a threshold from the baseline value, i.e. the effect of the diffusion on the signal is the same in any direction and the spins are stationary, with respect to a given pixel the isotropic signal intensity ($\sqrt[3]{S_x \cdot S_y \cdot S_z}$) will be displayed or the signal intensity of the baseline image is displayed.

FIG. 3 shows an overview of steps in a method of monitoring according to an embodiment. It is assumed that the contrast agent has been administered to the patient in a conventional manner. At step 100, resonance is detected by the detector. The data relating to this first detection of resonance is then stored electronically for later comparison purposes. At step 105, dephasing is carried out, followed by an inversion of phase at step 110, then another application of the magnetic gradient to rephrase the spins at step 120. In principle the gradient could be reversed and the inversion left out to achieve the same effect. At step 130 a second acquisition of data of detection of resonance is carried out. The second data can be stored electronically. The second data relating to detection of resonance is then compared to the first measured resonance to detect movement of the contrast agent tCA as described above. At step 140 this is repeated for different directions, such as x, y and z directions. At step 150, the movements in different directions are compared to detect isotropic movement. As indicated above these steps are carried out such that the signal intensity is analysed on a pixel-by-pixel basis with different diffusion directions by the image generator and compared to the signal intensity in an image recorded with the diffusion gradient switched to zero, e.g. the baseline image. If there is a difference in signal intensity in one or more directions, the diffusion has an anisotropic component and the pixel will be assigned the lowest signal intensity of the various images or it will be set to zero. If the diffusion is isotropic and within a threshold from the baseline value, i.e. the effect of the diffusion on the signal is the same in any direction and the spins are stationary, with respect to a given pixel the isotropic signal intensity ($\sqrt[3]{S_x \cdot S_y \cdot S_z}$) will be displayed or the signal intensity of the baseline image is displayed.

This is all repeated for different voxels of the target at step 160. Finally at step 170, an image is formed with de-emphasis of any voxels found to have anisotropic movement (indicating unbound tCA).

The steps can be carried out in other orders, for example steps 100 to 120 can be repeated for different directions and different voxels before any processing to detect movement and detect isotropic movement. Comparison with the baseline images reveals the stationary isotropic values. Images can be formed and compared to later images for example. Averaging of a number of detection cycles can be used. Two or more images with different gradient duration and amplitude (b-values) can be used. The gradients can be set and thresholds set according to expected rates of movement or diffusion of the contrast agent being used. While a T1 weighted pulse sequence is diffusion sensitive, and so in principle can be used without diffusion gradients, a quantitative diffusion pulse sequence is preferred, having two strong symmetrical gradient lobes placed on either side of the 180° refocusing RF pulse in a spin echo pulse sequence. These symmetrical gradient lobes enhance the dephasing of spins, thereby accelerating the intravoxel motion signal loss. Dephasing is proportional to the square of the time (diffusion time) during which the gradients are switched on and the strength of the applied gradient field. Therefore, the use of high field gradient systems with faster and more sensitive sequences, can make the diffusion weighting more useful.

The embodiments can be used when certain types of targeted contrast agents (tCA) are used. For diagnostic purposes, physicians are often only interested in the bound tCA. The embodiments of the invention can be particularly useful either when the stability of the tCA does not allow a wait for the wash-out of the unbound tCA, or when the presence of a certain amount of unbound tCA is necessary to keep part of the tCA bound.

As has been described, the method or apparatus can involve monitoring at multiple locations on the target and using the results of the monitoring to form an image of the bound contrast agent. They can involve applying a magnetic field gradient in a first direction to dephase spins of the contrast agent, rephasing the spins, and comparing the resonance after rephasing with the resonance before dephasing, to determine movement in the first direction. The dephasing and rephasing can be repeated in other directions to detect movement in other directions. The discriminating of the bound part of the contrast agent can involve determining if movement in any of the directions is below a threshold. The rephasing can involve inverting the phase of the spins then repeating application of the magnetic field gradient. A stationary spin map can be formed by comparing the movement in all the directions for each location and if the differences in movements are less than a given threshold, determining that the movement is isotropic for that location. If the signal intensity of these isotropic voxels is within a given threshold of the signal intensity in the baseline image, the stationary spins are displayed.

Other variations and advantages can be envisaged within the claims.

The invention claimed is:

1. A method of processing data relating to detected magnetic resonance of a contrast agent obtained by magnetic resonance monitoring of an object being a human or animal body, the method comprising:
monitoring magnetic resonance to detect magnetic resonance signals of contrast agent in the object, the magnetic resonance signals having signal intensities that are sensitive to movement of the contrast agent with respect to the object,
determining from the detected magnetic resonance signals contrast agent which is moving relative to the object,
wherein the method comprises
discriminating from the contrast agent which is moving relative to the object, a part of the contrast agent which is bound to the object, wherein the magnetic resonance monitoring is performed at multiple locations on the object, the method comprising:
using the results of the monitoring to form an image of the bound contrast agent by de-emphasis of any parts of the bound contrast agent in the image found to have anisotropic movement, the de-emphasis comprising assigning pixels in the image corresponding with an anisotropic moving contrast agent a zero or the lowest signal intensity value.

2. The method of claim 1, wherein the contrast agent is a targeted contrast agent.

3. The method of claim 1 wherein the contrast agent has a unique MR signature, or has a proton signal at a unique chemical shift compared to water.

4. A method of processing data relating to detected magnetic resonance of a contrast agent obtained by magnetic resonance monitoring of an object being a human or animal body, the method comprising:
monitoring in magnetic resonance to detect magnetic resonance signals of contast agent in the object, the magnetic resonance signals having signal intensities that are sensitive to movement of the contrast agent with respect to the object,
determining from the detected magnetic resonance signals contrast agent which is moving relative to the object,
wherein the method comprises
discriminating from the contrast agent which is moving relative to the object, a part of the contrast agent which is bound to the object, wherein monitoring magnetic resonance to detect magnetic resonance signals of contrast agent in the object comprises applying a magnetic field gradient in a first direction to dephase spins of the contrast agent.

5. The method of claim 4, wherein monitoring magnetic resonance to detect magnetic resonance signals of contrast agent in the object furthermore comprises rephasing the spins, the method comprising: comparing resonance of the contrast agent after rephasing with resonance of the contrast agent before dephasing, to determine movement in the first direction of the contrast agent.

6. The method of claim 5 wherein the detected magnetic resonance is obtained by repeating the steps of dephasing and rephasing in other directions, the method comprising detecting movement of the contrast agent in the other directions.

7. The method of claim 6, the discriminating of the bound part of the contrast agent having the step of determining if movement in any of the directions is below a threshold value.

8. The method of claim 5, the rephasing includes inverting the phase of the spins then repeating application of the magnetic gradient.

9. The method of claim 8 wherein the contrast agent comprises fluorine.

10. The method of claim 4 further comprising the step of assessing presence of isotropic movement of contrast agent by comparing the movement of contrast agent in all the directions for each location and if the differences in movements are less than a given threshold value, determining that the movement is isotropic for that location.

11. The method of claim 10, where the isotropic movement is analyzed and if it is below a given threshold the movement is stationary for that location.

12. Magnetic resonance monitoring apparatus having a detector to detect magnetic resonance of a contrast agent in an object being a human or animal body, the apparatus comprising means for monitoring magnetic resonance to detect magnetic resonance signals that are sensitive to movement of the targeted contrast agent, a movement detector to determine movement of the contrast agent relative to the object using the detected magnetic resonance, wherein the magnetic resonance monitoring apparatus comprises a discriminator to discriminate a part of the contrast agent which is bound to the object, from the rest of the contrast agent which is moving relative to the object using the detected movement and further comprising a magnet controller for applying a magnetic gradient in a first direction to dephase spins of the contrast agent.

13. The apparatus of claim 12, arranged to monitor multiple locations on the body and having an image generator to form an image of the bound contrast agent using the results of the monitoring.

14. The apparatus of claim 12, the magnet controller being arranged to dephase and then rephase the spins to thereby determine movement in the first direction.

15. The apparatus of claim 14, the magnet controller being arranged to repeat the steps of dephasing and rephasing in other directions to enable detection of movement in other directions.

16. The apparatus of claim 15, the discriminator being arranged to determine if movement in any of the directions is below a threshold.

17. The apparatus of claim 15, the discriminator having a comparator arranged to compare the movement in all the directions for each location to determine whether the movement is isotropic for that location, and that the isotropic movement does not exceed a given threshold and the image generator being arranged to form a map for the stationary spins from an output of the comparator.

18. A method of processing detected magnetic resonances of a contrast agent in an object to produce a stationary spin map, the method comprising using detected magnetic resonances to determine movement of the contrast agent relative to the object in a number of directions, comparing the movements in the different directions, determining if the differences are less than a given threshold to determine that the movement is isotropic for that location, and forming the stationary spin map by determining isotropic movement for a number of locations.

* * * * *